United States Patent [19]
Huang et al.

[11] Patent Number: 5,854,136
[45] Date of Patent: Dec. 29, 1998

[54] THREE-STEP NITRIDE ETCHING PROCESS FOR BETTER CRITICAL DIMENSION AND BETTER VERTICAL SIDEWALL PROFILE

[75] Inventors: Shih Chang Huang; Yuh Da Fan; Yung-Jung Chang, all of Hsin-Chu, Taiwan

[73] Assignee: Taiwan Semiconductor Manufacturing Company, Ltd., Hsin-Chu, Taiwan

[21] Appl. No.: 620,732

[22] Filed: Mar. 25, 1996

[51] Int. Cl.⁶ ..................................... B44C 1/22
[52] U.S. Cl. .......................... 438/714; 438/724; 438/734; 438/738; 438/744; 216/67; 216/71; 216/72; 216/79
[58] Field of Search ..................... 438/713, 714, 438/724, 734, 735, 738, 744; 216/67, 71, 72, 79

[56] References Cited

U.S. PATENT DOCUMENTS

| | | |
|---|---|---|
| 4,374,698 | 2/1983 | Sanders et al. ......................... 438/724 |
| 4,793,897 | 12/1988 | Dunfield et al. ....................... 438/724 |
| 5,013,398 | 5/1991 | Long et al. ............................. 438/714 |
| 5,015,331 | 5/1991 | Powell .................................... 438/723 |
| 5,354,417 | 10/1994 | Cheung et al. ......................... 438/721 |
| 5,431,772 | 7/1995 | Babie et al. ............................ 438/714 |

*Primary Examiner*—Bernard P. Codd
*Attorney, Agent, or Firm*—George O. Saile; Stephen B. Ackerman

[57] ABSTRACT

This invention describes a three-step process for etching a layer of silicon nitride over a thin layer of silicon dioxide on a semiconductor substrate for producing silicon nitride pattern with nearly vertical sidewalls, very small critical dimension bias and no trenching in the silicon dioxide, comprising a first step of a highly anisotropic etch process with a high etch rate, achieved by adding $CHF_3$ to the gaseous mixture of $SF_6$ and He, carried out at a relatively high power and low pressure, used to etch the bulk of the silicon nitride layer, a second step of lower etch anisotropy and etch rate, achieved by replacing $CHF_3$ with HBr, carried out at higher pressure and lower power, used to etch out the remainder of the nitride layer with a small over-etch beyond the end point, a third step of high $Si_3N_4/SiO_2$ etch selectivity, achieved by adding an oxidant to the reactive gas mixture, used to remove any remaining silicon nitride residues.

20 Claims, 3 Drawing Sheets

THREE-STEP NITRIDE ETCHING PROCESS FOR BETTER CRITICAL DIMENSION AND BETTER VERTICAL SIDEWALL PROFILE

BACKGROUND OF THE INVENTION

1. Field of the Invention

This invention relates to a method for etching silicon nitride films over pad oxides to produces patterns of silicon nitride film having nearly vertical sidewalls, used for sub-micron, and particularly sub-half-micron, devices in semiconductor integrated circuits.

2. Description of the Related Art

In semiconductor devices and integrated circuits, silicon nitride films are commonly used for the purpose of surface passivation, and as a barrier against impurity contamination; it is also commonly used as an oxidation barrier for such purpose as the LOCOS (LOCal Oxidation of Silicon), the usual means for the formation of field oxides required under metal interconnects. The silicon nitride film is usually formed atop a thermal silicon dioxide commonly known as the pad oxide, which serves both to minimize the density of the silicon surface states and to cushion the semiconductor substrate from the large intrinsic tensile stress usually found in the silicon nitride film. In very small devices of submicron, and particularly the half micron and smaller dimensions, it is necessary that the patterning of the silicon nitride films is made by reactive ion etching (or plasma etching), which is anisotropic, as opposed to chemical etching which is isotropic.

The patent of Powell (U.S. Pat. No. 5,015,331, May 1991) is mainly concerned with a new design of a plasma etching parallel plate reactor by placing a grid at the same potential with the lower electrode, using it to enhance the etch selectivity of silicon nitride with respect to photoresist, using a gaseous mixture of $NF_3$, He, and $O_2$ or to enhance the etch selectivity of oxide with respect to photoresist, using a gaseous mixture of $NF_3$ and He.

The patent of Babie et al. (U.S. Pat. No. 5,431,772, Jul. 1995) described a two-step method of etching silicon nitride film, and was mainly concerned with the problem of possible contamination of the surface of the silicon nitride film by oxygen-containing substances such as silicon dioxide or silicon oxynitride. That invention comprises a first step of removing the surface oxide or oxynitride from the silicon nitride layer in a reactive plasma of fluorine-containing gases consisting essentially of $SF_6$, $CF_4$, $C_2F_6$ and $NF_3$. In the second step, the main etch step, the silicon nitride layer is etched with a high selectivity with respect to the etching of the silicon dioxide underlayer, using a reactive plasma gas mixture of HBr, or HBr and $SiF_4$, and an oxidant selected from the group consisting of $O_2$, $CO_2$, or $N_2O$ and a diluent gas such as He, $N_2$, or Ar. The optimum process conditions are described to be as follows: HBr flow 20.00 sccm, $O_2$ flow 0.45 sccm, He flow 1.05 sccm, pressure 100 mTorr, power density 1.65 W/cm$^2$, magnetic field 45 gauss, giving an etch rate of 600 Å/min. They have mentioned a $Si_3N_4$/$SiO_2$ etch selectivity of 12.6:1.

Other prior art inventions have also described silicon nitride etch processes with high selectivities with respect to silicon dioxide underlayer. For example, U.S. Pat. No. 4,374,698 of Sanders et al. described a process with a $Si_3N_4$/$SiO_2$ etch selectivity of 5, using a gaseous mixture containing 62.5% of $SiF_4$, some $CF_3Br$ or $CF_2Cl_2$, and an oxidant gas such as NO (30%) or $O_2$ (3–10%) under the preferred process conditions of 100 Pa pressure and an RF power 150 W, with a substrate temperature of 125 degrees centigrade. U.S. Pat. No. 4,793,897 of Dunfield et al. described a "Selective Film Etch Process" using a gaseous mixture of $NF_3$, $SiF_4$, $O_2$ and He at a pressure of 0.5 to 30 mTorr and an RF power of 100–150 W to achieve a high $Si_3N_4$/$SiO_2$ etch selectivity.

In the fabrication of all kinds of integrated circuit devices, a high $Si_3N_4$/$SiO_2$ etch selectivity is important for accurately controlling the etch end point and preventing damage to the silicon substrate by over etching the oxide. The enhancement of the $Si_3N_4$/$SiO_2$ etch selectivity is the aim of the prior art inventions mentioned above. However, these prior art inventions have not addressed issues that become very important in the fabrication of submicron devices, and particularly devices that are 0.5 $\mu$m or smaller. A very important issue is the requirement of the ability of etch process is to accurately conform to the critical dimension of these small devices. The critical dimension is determined not just by the accuracy of the photolithography that defines the nitride pattern, but also by the degree of etch anisotropy of the silicon nitride film. A very high degree of etch anisotropy is desirable to produce highly vertical sidewalls of the silicon nitride film, thereby conforming to the critical dimension from the top to the bottom of the silicon nitride layer. A low etch anisotropy will produce undesirable sloping sidewalls of the silicon nitride layer, causing deviation from the required critical dimension.

Beside the silicon nitride etch processes described by the aforementioned prior art inventions, traditional nitride etch process currently in use is a two-step process comprising a main step using $SF_6$ and He in the gaseous plasma to get near the end point, and a second step of high $Si_3N_4$/$SiO_2$ etch selectivity using $SF_6$ and $O_2$ in the gaseous plasma so as to prevent the occurrence of nonuniform patches of unremoved silicon nitride without unduly over-etching the pad oxide underneath the silicon nitride. Thus, the second etch step is an over-etch step for silicon nitride, but is one that will not over etch the pad oxide. Refer now to FIG. 1, in which 1 is the silicon substrate, 2 is the pad oxide, 3 is the silicon nitride layer, and 5 is the photoresist which has already been developed to give the desired pattern. The structure of FIG. 1 is now ready for the reactive ion etching of the silicon nitride. The main etch step of this two-step process generates a 65 to 75 degrees profile on the nitride sidewalls 4, as shown in FIG. 2. Such a sloping sidewall in the silicon nitride pattern seriously deviates from desired critical dimensions, and is not acceptable for sub-half-micron devices. The current etch process we developed earlier is also a two-step process, using a gaseous mixture that additionally contains $CHF_3$ in the first step, the main etch step, which produces desirable vertical sidewalls in the silicon nitride pattern. However, if allowed to go to the end point, this process induces trenches in the pad oxide adjacent to the nitride edges, as indicated by 6 in FIG. 3. Sometimes, it can even penetrate and damage the silicon substrate and cause device failure. As an example of the result of the over-etch using 95% of the end point as trigger, using a gaseous mixture, in terms of flow rate, of $CHF_3$ at 10 sccm, He at 250 sccm, and $SF_6$ at 70 sccm, with a gas pressure of 300 mTorr, and RF power of 260 W, and an electrode gap of 0.9 cm, the loss of pad oxide is 184 Å adjacent to the nitride edge, and 142 Å at the center between two nitride lines. Trenching of pad oxide can be avoided if the main etch step is not carried to the end point. Due to nonuniformity in both the nitride film and the etching process, however, this then requires the main etch step to reach a little short of the end point, and consequently a long over-etch step. The over-etch step is not highly anisotropic, and will etch the nitride sidewalls, causing them to recede as shown in FIG. 4, and consequently resulting in a large critical dimension bias: that is, the line width of silicon nitride pattern comes out narrower than the critical dimension defined by photolithography. An example of a measured critical dimension bias is −0.083 $\mu$m, which is not acceptable for sub-half-micron devices.

SUMMARY OF THE INVENTION

This invention describes a three-step process for etching pattern in a layer of silicon nitride over a thin layer of silicon dioxide known as "pad oxide" to produce nearly vertical sidewalls of the silicon nitride layer, a critical feature required in the fabrication of submicron devices, and particularly devices having critical dimensions of 0.5 $\mu$m or smaller. The first step, which we shall call Main Etch 1 (ME1) is a highly anisotropic etch process with a high etch rate, and is achieved by adding $CHF_3$ to the gaseous mixture of $SF_6$ and He in the main etch step. This etch step is carried out at a relatively high power and low pressure, and achieves nearly vertical sidewall. Because the addition of $CHF_3$ to the reactive gaseous mixture causes trenching of the pad oxide, as well as critical dimension bias, the first step is used to etch the bulk (about 80%) of the silicon nitride rather than to etch to the end point. The second step, which we shall call Main Etch 2 (ME2), replaces $CHF_3$ with HBr and is carried out at higher pressure and lower power, and is carried to a small over-etch beyond the end point. The third step is an over-etch step (OE) with a very high $Si_3N_4/SiO_2$ etch selectivity, intended for removing silicon nitride residues that may still be remaining on the pad oxide due to nonuniformity in the nitride film and in the ME1 and ME2 etching. Oxygen, or another oxidant, is added to the reactive gaseous mixture in this step to enhance etch selectivity. Thus, the etch process of this invention produces nearly vertical nitride sidewalls, and at the same time eliminates the pad oxide trenching and reduces the critical dimension bias.

DESCRIPTION OF THE PREFERRED EMBODIMENT

The gaseous plasma for etching silicon nitride traditionally contains $SF_6$ as the main reactive component, together with other reactive or inert gaseous components such as He.

To produce nearly vertical sidewalls in silicon nitride layer for sub-half-micron devices, a highly anisotropic reactive ion etching process is required. We have found that adding $CHF_3$ to the gaseous plasma increases both the etch anisotropy and the etch rate, both being desirable characteristics. This gaseous mixture, under relatively low pressure and relative high RF power, tends to produce desired nearly vertical sidewalls in the silicon nitride pattern.

Figure 1:
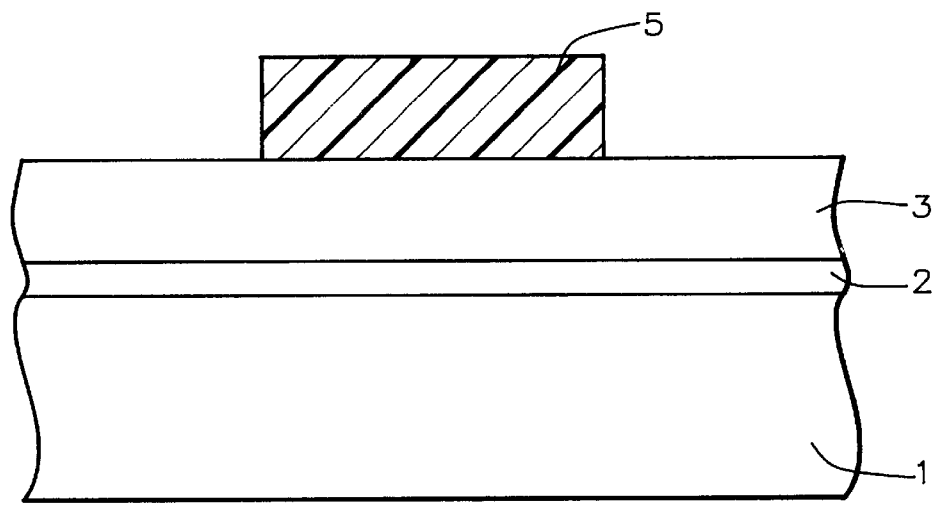
FIG. 1 shows a silicon nitride layer over a pad oxide on a silicon substrate, with a developed photoresist on it, ready for reactive ion etching, a structure up to this point identical for both the prior art and the present invention.
Figure 2:
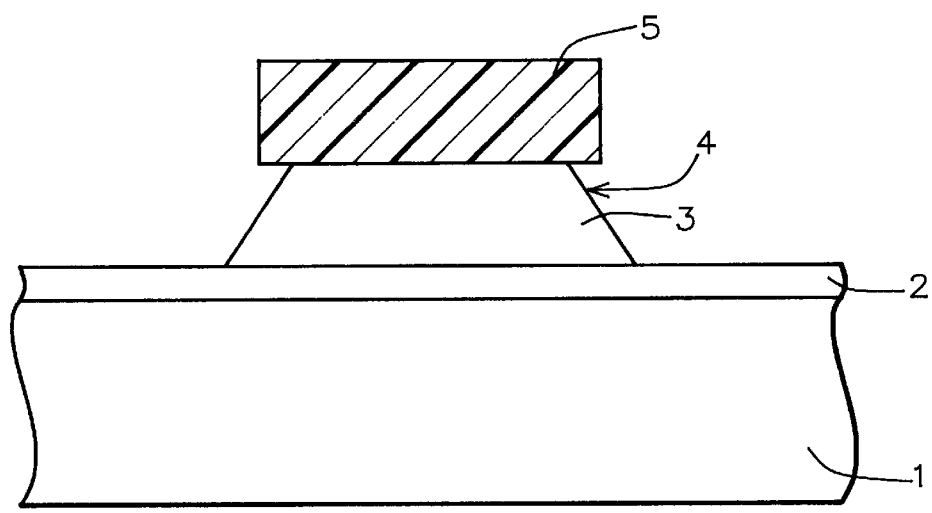
FIG. 2 shows the prior art resulting structure of a silicon nitride line pattern with sloping sidewalls following a traditional nitride etch process.

Start with the structure shown in FIG. 1, with a photoresist already developed for the desired pattern on the silicon nitride layer. The wafer with the structure of FIG. 1 is placed in a reactive ion etching chamber. Gases are fed into the chamber preferably at the following flow rates: $SF_6$ at 180 sccm, $CHF_3$ at 20 sccm and He at 250 sccm. The process conditions are: gas pressure at 250 mTorr, RF power at 260 W, and electrode gap at 1.05 cm. Under these conditions, the etch rate is about 3000 Å/min (2,904 Å/min in one example), and the uniformity is 2.3%. In addition to the gas ingredient $CHF_3$, the low gas pressure and the high RF power all contribute to a high etch rate and a very high etch anisotropy to produce a very vertical nitride sidewall profile, as desired. Since ME1 is used only to etch about 80% of the silicon nitride layer, and is sufficiently far away from the end point, the $Si_3N_4/SiO_2$ etch selectivity is not a consideration in this step.

Figure 3:
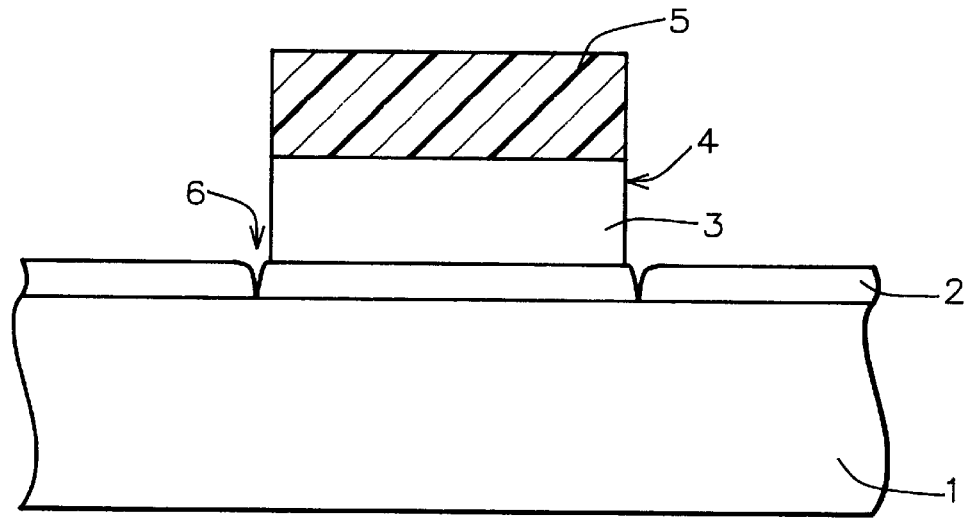
FIG. 3 shows the prior art resulting structure of a silicon nitride line pattern with nearly vertical sidewalls and a pad oxide with trenches adjacent to the sidewalls following a current etch process which includes $CHF_3$ in the reactive gaseous mixture in the main etch step that reaches beyond the end point.
Figure 5:
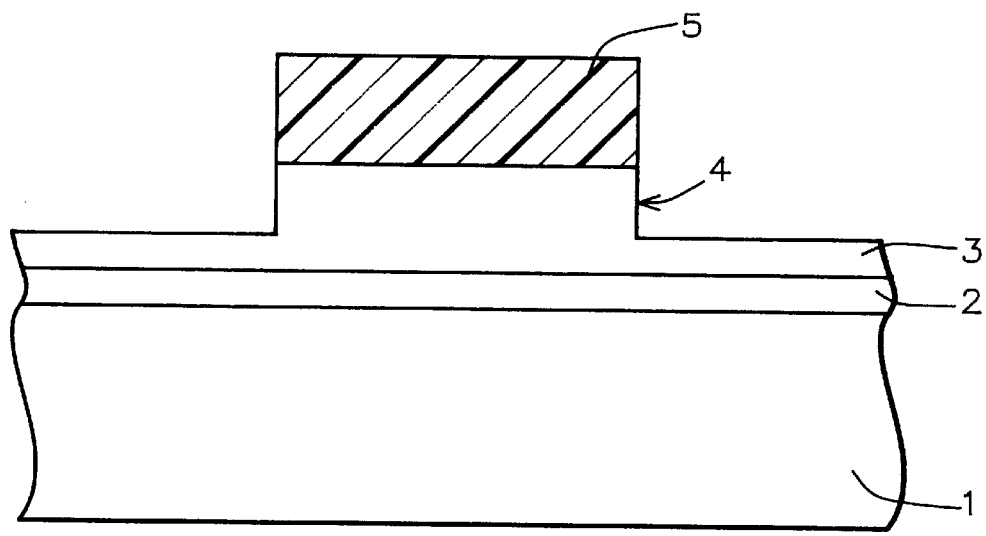
FIG. 5 shows the resulting structure of a silicon nitride line pattern with nearly vertical sidewalls following the first etch step of this invention.

As mentioned in the prior art section, we found that $CHF_3$ causes trenching of the pad oxide adjacent to the edges of the silicon nitride sidewalls, as shown in FIG. 3. To avoid trenching of the pad oxide and possible damage to the silicon substrate, therefore, the first etch step, which we refer to as Main Etch 1 (ME1), is used to etch down only 80% of the silicon nitride layer. The resulting structure after ME1 is shown in FIG. 5. To attempt to etch closer, to but not yet reaching, the end point is not practical because of nonuniformity in both the nitride film and the etching process; but we recognize the feasibility of using ME1 to etch more the said 80% of the nitride.

Figure 4:
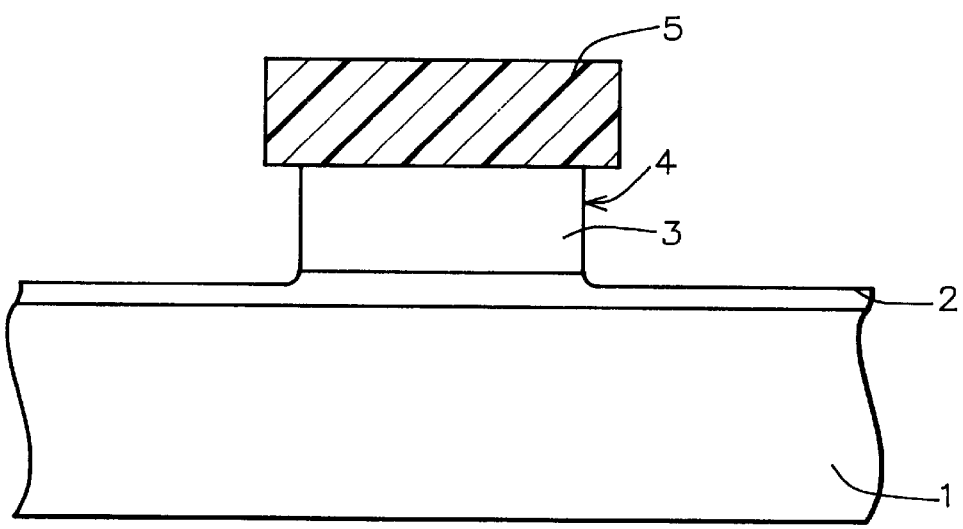
FIG. 4 shows the prior art resulting structure of a silicon nitride line pattern with nearly vertical sidewalls which receded from the edges of the photoresist following a current etch process which includes $CHF_3$ in the reactive gaseous mixture in the main etch step that stop short of the end point, followed by a long highly selective over-etch.
Figure 6:
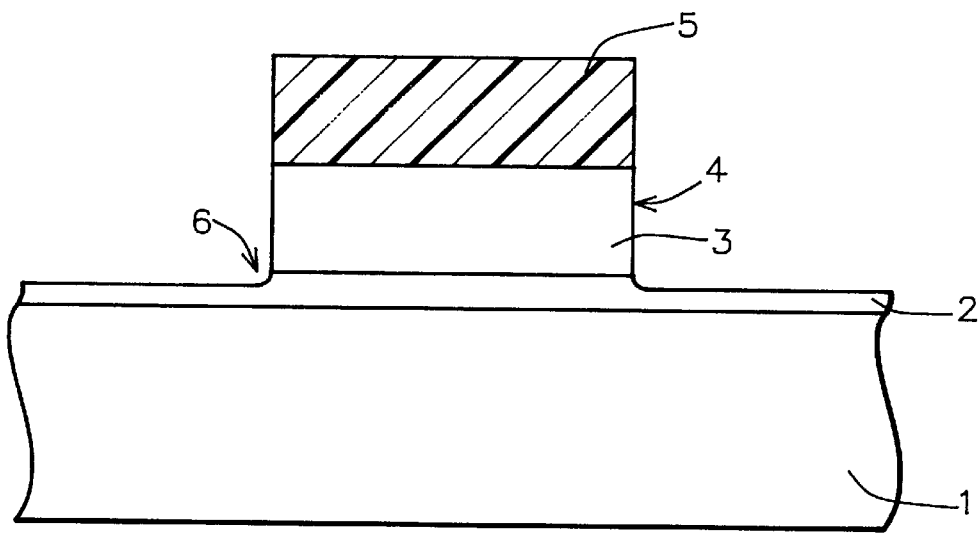
FIG. 6 shows the resulting structure of a silicon nitride line pattern following the second etch step of this invention.

If ME1 step is followed next by the traditional highly selective over-etch step to remove the remaining nitride film, including any residues that may exist, it would require a long over-etch because of its low etch rate, about 570 Å/min using the over-etch composition and process conditions. Because the over-etch process is not as highly anisotropic as ME1 etch process, it will also etch the nitride sidewalls at a significant rate, causing them to recede from the horizontal positions defined by the photoresist pattern, as shown in FIG. 4. We call this phenomenon critical dimension bias. A typical value of the critical dimension bias from the such over-etch step is about 0.08 $\mu$m, whereas a typical value of the critical dimension bias from ME1 is only about 0.02 $\mu$m, which is acceptable. In the method of this invention, a second step of main etch is added, which we refer to as Main Etch 2 (ME2), which is used to etch the silicon nitride to the end point and slightly beyond, preferably 4 to 5 seconds, or about 10% over-etch of the silicon nitride, beyond the end point. The reactive gaseous mixture in ME2 does not contain $CHF_3$, but contains instead HBr. The preferred gas composition for ME2, as determined by the flow rates of various components, is as follows: HBr at 30 sccm, $SF_6$ at 120 sccm, He at 250 sccm. The gas pressure is increased to 450 mTorr, the RF power is reduced to 210 W, and the electrode gap is increased to 1.2 cm. With these process parameters, the etch rate is about 1500 Å/min (1402 Å/min in one example), the $Si_3N_4/SiO_2$ etch selectivity is 2.1, and the etch uniformity is 3.3%. The ME2 step is used to etch to the end point, using 95% of the end point as trigger, plus an additional 10% over etch. This will slightly etch into the pad oxide, as shown in FIG. 6. The additional 10% over etch, for about 4 seconds in etch time, is used to reduce the length of step 3, the over-etch step (OE), required to insure complete removal of all residues. The reason for the preference for the additional over-etch with ME2 over a long OE is that ME2, although having a smaller $Si_3N_4/SiO_2$ etch selectivity than OE, does not etch the sidewalls of the silicon nitride layer significantly, thereby allowing a reduction in the critical dimension bias that would have occurred with a longer OE step. In fact, ME2 does not produce a sidewall profile as vertical as does ME1, and tends to produce slight flares in the sidewalls, as indicated by 6 of FIG. 6. This sloping is however not as significant as schematically shown, and does not has much impact on the critical dimension because this sloping occurs only in the bottom 20%, or less, of the silicon nitride layer.

The third step is the traditional Over-Etch (OE) step, which is used for another 10% over-etch. The gaseous mixture has the following composition in terms of flow rates: HBr at 20 sccm, $O_2$ at 10 sccm, and $SF_6$ at 120 sccm. The gas pressure is further increased to 650 mTorr, the RF power is further reduced to 200 W, and the electrode gap is kept at 1.2 cm. With these process parameters, the etch rate is about 400 Å/min (570 Å/min in one example) and the $Si_3N_4/SiO_2$ etch selectivity is 10, with a 2.6% etch uniformity. The structure after the OE step is not appreciably different from the structure shown in FIG. 6, the reason being that, because of the very high $Si_3N_4/SiO_2$ etch selectivity of the OE step, only the silicon nitride in the areas not covered by the photoresist pattern will be significantly etched away in this OE step, while very little of the pad oxide will be etched away. But the silicon nitride, except some random residues, in all areas not covered by the photoresist had already been etched away by the over-etching in ME2, the OE step accomplishes only the cleaning up of any remaining randomly scattered residues not shown in FIG. 6. The total critical dimension bias after the third etch step is about $-0.035$ $\mu m$, compared to a value of $-0.08$ $\mu m$ obtained using the traditional etch method.

The preferred gaseous compositions and process conditions are summarized for clarity in Table 1. While the preferred process conditions and reactive gas compositions have been thus described, it is apparent to those skill in the art of the fabrication of semiconductor devices that numerous variations of these process parameters and gaseous compositions are possible to achieve the same objective while still adhering to the three-step etch concept of this invention.

What is claimed is:

1. A three-step method of etching silicon nitride layers over pad oxides in semiconductor integrated circuits, comprising the steps of:

a first step of a main etch (ME1) using a reactive gas mixture of $SF_6$, $CHF_3$ and He, to remove 80% to 90% of the silicon nitride layer;

a second step of a main etch (ME2) using a reactive gas mixture of HBr, $SF_6$ and He to remove the remainder, except for any remaining residues, of the silicon nitride layer; and a third step of an over-etch (OE), to remove any of the remaining residues of silicon nitride.

2. The method of claim 1 wherein said first step etch ME1 uses a reactive gas mixture having a composition, as mea sured by the flow rates of individual gas components, of $SF_6$ at 180±20 sccm, $CHF_3$ at 20±2 sccm and He at 250±25 sccm.

3. The method of claim 1, wherein the process conditions for said first etch step ME1 are: gas pressure at 250±25 mTorr, RF power at 260 W±10%, and electrode gap at 1.05 cm±10%.

4. The method of claim 1 wherein said second etch step ME2 uses a reactive gas mixture having a composition, as measured by the flow rates of individual gas components, of HBr at 30±3 sccm, $SF_6$ at 120±12 sccm, He at 250±25 sccm.

5. The method of claim 1 wherein the process conditions for said second etch step ME2 are: gas pressure at 450±50 mTorr, RF power at 210 W±10%, and the electrode gap at 1.2 cm±10%.

6. The method of claim 1 wherein said second etch step ME2 is used to etch most of the remainder of the silicon nitride layer, except for any remaining residues to an end point.

7. The method of claim 1 wherein said third etch step OE uses a reactive gas mixture containing a gas component of $O_2$.

8. The method of claim 1 wherein said third etch step OE uses a gas mixture containing no $CHF_3$.

9. The method of claim 1 wherein said third etch step OE uses a reactive gas mixture having a composition, as measured by the flow rates of individual gas components, of HBr at 20±2 sccm, $O_2$ at 10±2 sccm, and $SF_6$ at 120±12 sccm.

10. The method of claim 1 wherein the process conditions for said third etch step OE are: gas pressure at 650±50 mTorr, RF power at 200±20 W, and the electrode gap at 1.2 cm±10%.

11. A method of making a pattern with sharp vertical sidewalls and good critical dimensions in first layer film of silicon nitride over a second layer film of oxide, using a three-step etching process, comprising the steps of:

a first main etch (ME1) in a plasma using a reactive gas mixture of $SF_6$, $CHF_3$ and He, to remove 80 to 90% of said first layer film of silicon nitride, A second main etch (ME2) in a plasma using a reactive gas mixture of HBr, $SF_6$ and He to remove the remaining part of said first layer, except for any remaining residues, with an equivalent to 10±5% beyond the end point of the etching of said first layer, and A third etch step to clean up any residues of said first layer material left over on said second layer film.

12. The method of claim 11 wherein the etch rate of ME1 is higher than the etch rate of ME2.

13. The method of claim 11 wherein the etch anisotropy, as defined by the ratio of the vertical to the lateral etch rate, for ME1 is larger than the etch anisotropy of ME2.

14. The method of claim 11 wherein the etch selectivity, as defined by the ratio of the etch rate of said first layer material to the etch rate of said second layer material of the third etch is greater than ME1 and ME2, and is greater than 5.

15. A method of etching silicon nitride layers over pad oxides in semiconductor integrated circuits, comprising the steps of:

performing a first etch step of said silicon nitride layer using a reactive gas mixture of $SF_6$, $CHF_3$ and He, to remove a bulk of said silicon nitride layer;

performing a second etch step to remove a remainder of said silicon nitride layer, except for any residues, using a reactive gas mixture of HBr, $SF_6$ and He, using a plasma etch at a higher power and lower pressure than in said first etch step; and performing a final etch step to remove any of the remaining residues of said silicon nitride.

16. The method of claim 15 wherein said first etch step is performed at a flow rate of between 160 and 200 sccm $SF_6$, between 18 and 22 sccm $CHF_3$, and between 225 and 275 sccm He.

17. The method of claim 15, wherein said first etch step is performed at a gas pressure of between 225 and 275 mTorr, an RF power of between 234 and 286 W, and an electrode gap of between 0.945 and 1.155 cm.

18. The method of claim 15 wherein said second etch step is performed at a flow rate of between 27 and 33 sccm HBr, between 108 and 132 sccm $SF_6$, and between 225 and 275 sccm He.

19. The method of claim 15 wherein said second etch step is performed at a gas pressure of between 400 and 500 mTorr, an RF power of between 189 and 231 W, and an electrode gap of between 1.08 and 1.32 cm.

20. The method of claim 15 wherein said third etch step uses a reactive gas mixture comprising HBr, $O_2$, and $SF_6$.

* * * * *